(12) United States Patent
Brunner et al.

(10) Patent No.: US 6,412,500 B1
(45) Date of Patent: Jul. 2, 2002

(54) DEVICE AND METHOD FOR CLEANING SEMICONDUCTOR WAFERS

(75) Inventors: Roland Brunner, Reut; Franz Sollinger, Polling; Hans-Joachim Luthe, Kastl; Georg-Friedrich Hohl, Altötting, all of (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/480,594

(22) Filed: Jan. 7, 2000

(30) Foreign Application Priority Data

Jan. 14, 1999 (DE) .......................... 199 01 162

(51) Int. Cl.⁷ .............................................. B08B 3/00
(52) U.S. Cl. .................... 134/64 R; 134/902; 15/77; 15/88.3
(58) Field of Search ............. 15/77, 88.3; 134/15, 134/64 R, 122 R, 902

(56) References Cited

U.S. PATENT DOCUMENTS

| | | | | |
|---|---|---|---|---|
| 4,618,292 A | * | 10/1986 | Judge et al. ............... | 406/19 |
| 5,081,733 A | | 1/1992 | Kudo ........................ | 15/77 |
| 5,108,513 A | * | 4/1992 | Muller et al. ............... | 134/15 |
| 5,853,522 A | | 12/1998 | Krusell et al. .............. | 156/345 |
| 5,950,327 A | * | 9/1999 | Peterson et al. ............. | 34/328 |
| 5,975,094 A | * | 11/1999 | Shurtiff ..................... | 134/1.3 |

FOREIGN PATENT DOCUMENTS

| | | |
|---|---|---|
| EP | 0 408 021 | 1/1991 |
| EP | 0691675 | 1/1996 |
| JP | 2-250324 | 10/1990 |

OTHER PUBLICATIONS

The English Derwent Abstract 1991–016253 [03] corresp. to EP 0 408 021 A1.
Patents Abstracts of Japan, E–1016, Dec. 21, 1990, vol. 14, No. 576, corresp. to JP 2–250324A.
Patents Abstracts of Japan, JP07066161A, Mar. 10, 1995.
Patents Abstracts of Japan, E–704, Jan. 17, 1989 vol. 13, No. 18, corres. to JP 63–224332A.
Patents Abstracts of Japan, E–708, Jan. 25, 1989 vol. 13, No. 34, corresp. to JP 63–234536A.

* cited by examiner

Primary Examiner—Randy Gulakowski
Assistant Examiner—Joseph Perrin
(74) Attorney, Agent, or Firm—Collard & Roe, P.C.

(57) ABSTRACT

A device for cleaning semiconductor wafers with a cleaning liquid, includes a cleaning station with a plurality of rotating pairs of rollers which are arranged one behind another and to which the cleaning liquid is applied. Each pair of rollers is formed by a top roller and a bottom roller, and the semiconductor wafer is conveyed between the pairs of rollers. There is also a conveyor means for conveying the semiconductor wafer to and from the cleaning station. The conveyor means has a film of conveyor liquid which is provided by the conveyor and on which the semiconductor wafer is conveyed. A supplying container provides the cleaning liquid to the top rollers in the form of a falling liquid which migrates over the rollers. There is also a method for cleaning semiconductor wafers in which such a device is used.

7 Claims, 3 Drawing Sheets

DEVICE AND METHOD FOR CLEANING SEMICONDUCTOR WAFERS

BACKGROUND OF THE INVENTION

1. Field of the Invention

The present invention relates to a device for cleaning semiconductor wafers with a cleaning liquid, comprising a cleaning station with a plurality of rotating pairs of rollers which are arranged one behind another and to which the cleaning liquid is applied, each pair of rollers being formed by a top roller and a bottom roller. The semiconductor wafer is conveyed between the pairs of rollers, and there is a conveyor means for conveying the semiconductor wafer to and from the cleaning station. The invention also relates to a method for cleaning semiconductor wafers in which such a device is used.

2. The Prior Art

A device for cleaning semiconductor wafers is disclosed in EP-691,675 A1, for example.

SUMMARY OF THE INVENTION

It is an object of the present invention to provide improvements to the prior art.

The present invention relates to a device which has a conveyor means which provides a film of conveyor liquid on which the semiconductor wafer is conveyed, and a means for supplying a cleaning liquid to the top rollers in the form of a falling liquid which migrates over the top rollers.

More particularly, the present invention is directed to a device for cleaning semiconductor wafers with a cleaning liquid, comprising a cleaning station with a plurality of rotating pairs of rollers which are arranged one behind another and to which the cleaning liquid is applied; each pair of rollers comprising a top roller and a bottom roller, and the semiconductor wafer being conveyed between the pairs of rollers; and a means for supplying the cleaning liquid to the top rollers in the form of a falling liquid which migrates over the rollers; and a conveyor means for conveying the semiconductor wafer to and from the cleaning station, and having a film of conveyor liquid which is provided by the conveyor means and on which film of conveyor liquid the semiconductor wafer is conveyed.

The present invention also relates to a method comprising conveying a semiconductor wafer to and from a cleaning station on a film of conveyor liquid, and supplying a cleaning liquid to top rollers of the pairs of rollers in the form of a falling liquid which migrates over the top rollers.

More particularly, the present invention is directed to a method for cleaning a semiconductor wafer with a cleaning liquid in a cleaning station comprising arranging in a cleaning station a plurality of rotating pairs of rollers one behind another; applying a cleaning liquid to the plurality of rollers; supplying the cleaning liquid to top rollers of the pairs of rollers in the form of a falling liquid which migrates over the top rollers; and conveying the semiconductor wafer between said pairs of rollers, and conveying the semiconductor wafer to and from the cleaning station on a film of conveyor liquid.

The present invention allows optimum cleaning of the semiconductor wafer combined with a minimum consumption of the cleaning liquid. It ensures that the cleaning liquid acts uniformly and that contamination of the semiconductor wafer is prevented. While it is being conveyed between the pairs of rollers, the semiconductor wafer only comes into contact with the film of cleaning liquid on the conveyor means. Thus the wafer contacts the cleaning liquid, but does not contact the solid components of the cleaning device, which may damage or contaminate the semiconductor wafer. The cleaning liquid is distributed uniformly over the semiconductor wafer, so that each surface of the semiconductor wafer undergoes the same treatment. Hence, a plurality of semiconductor wafers can be treated in succession in the same way. Further advantages of the invention are given in the following description, which is based on figures. The figures show only those features which contribute to a better understanding of the invention. Identical features are denoted by the same reference numerals.

BRIEF DESCRIPTION OF THE DRAWINGS

Other objects and features of the present invention will become apparent from the following detailed description considered in connection with the accompanying drawings which discloses several embodiments of the present invention. It should be understood, however, that the drawings are designed for the purpose of illustration only and not as a definition of the limits of the invention.

In the drawings, wherein similar reference characters denote similar elements throughout the several views:

FIG. 2b shows the way in which a lifting means lowers a wafer in accordance with FIG. 2a.

DETAILED DESCRIPTION OF PREFERRED EMBODIMENTS

Figure 1:
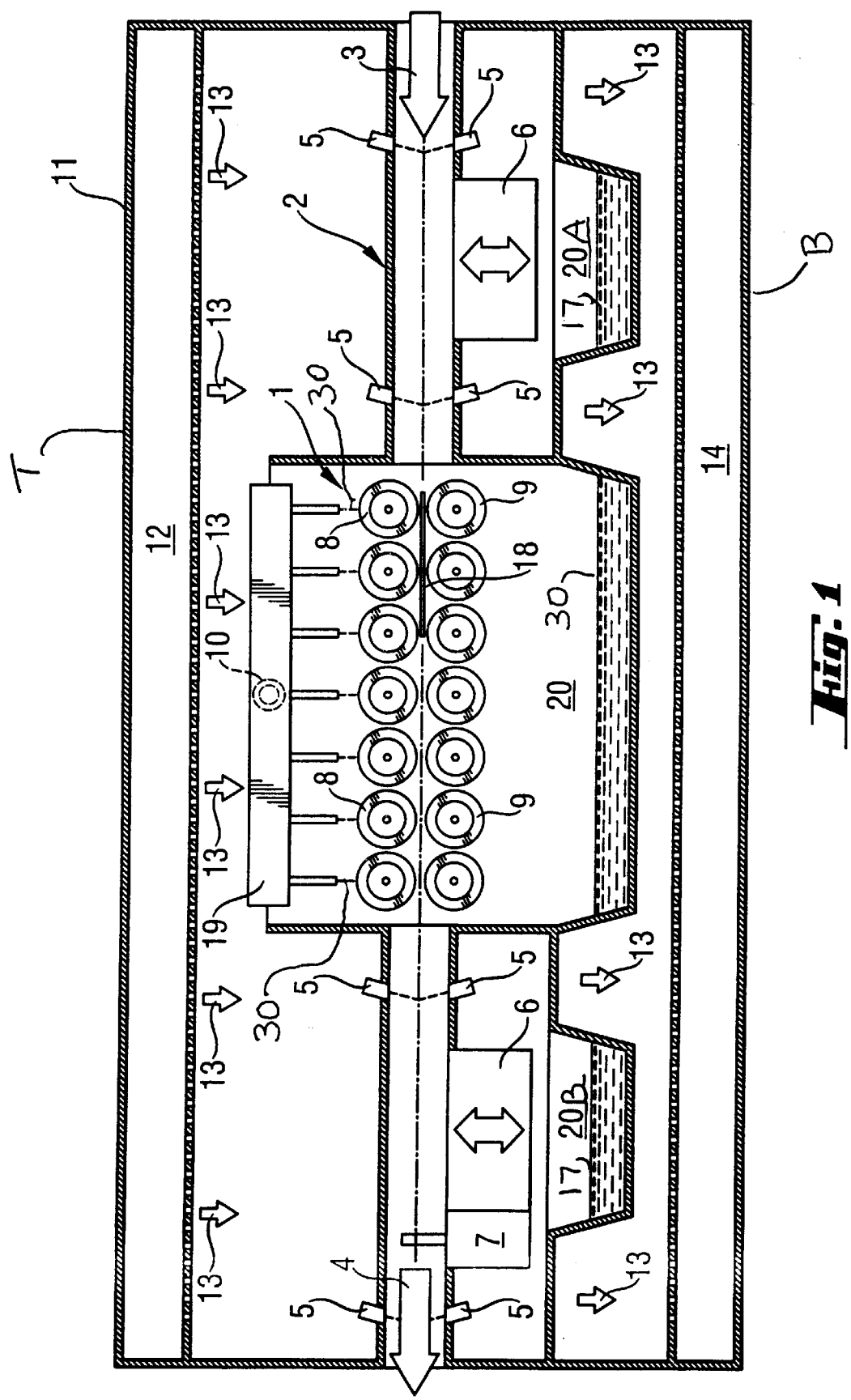
FIG. 1 shows a diagrammatic illustration of a longitudinal section through a cleaning device according to the invention.

Turning now in detail to the drawings, the device in FIG. 1 comprises a cleaning station 1 in which the semiconductor wafer is cleaned. There is a conveyor means 2 for conveying the semiconductor wafer to and from the cleaning station; and there are transfer and pick-up stations 3 and 4 at the ends of the conveyor means 2. The stations 3 and 4 are only indicated as arrows in FIG. 1. The transfer and pick-up stations advantageously each include commercially available robots used to manipulate semiconductor wafers.

The conveyor means 2 provides a film of liquid which is moved by means of nozzles 5 and on which the semiconductor wafer glides. A conveyor means which is suitable for the device according to the invention is described, for example, in EP-408,021 A1. It is preferable for the nozzles to dispense a greater amount of conveying liquid, such as water, and preferably ultrapure water, when a semiconductor wafer is to be conveyed. To make it easier to transfer and pick up the semiconductor wafer, it is preferable for a lifting means 6 and means 7 for centering the semiconductor wafer to be provided at the beginning and end of the conveyor path.

The cleaning station 1 essentially comprises pairs of rollers which are arranged one behind another, with a pair of rollers being formed by a top roller 8 and a bottom roller 9. Preferably, from 2 to 28, particularly preferably 7, pairs of rollers are provided in the cleaning station 1. The rollers preferably comprise plastic shafts which are coated with foamed materials, such as polyvinyl alcohol (PVA). The cleaning station 1 also has a means 10 for supplying a cleaning liquid to the top rollers of the pairs of rollers and means 20 for collecting liquids, allowing the liquids to be reused if appropriate. The means 10 for supplying the cleaning liquid is located above the top rollers 8 and comprises a trough system of feed pipes 19, through which the cleaning liquid is supplied to the top rollers. The cleaning station 1 and the conveyor means 2 are accommodated in a housing 11. Means 12 is provided in the top T of the housing for generating a laminar gas flow 13 in the housing, transversely with respect to the direction in which the semiconductor wafer is conveyed. Means 14 for extracting the gas flow is also provided in the bottom B of the housing. The latter means 14 will avoid the formation of turbulence and thus reduce the risk of contamination to the semiconductor wafer from particles. It is preferable for a clean-room environment of at least Class 10 to be established in the housing.

Figure 2A:
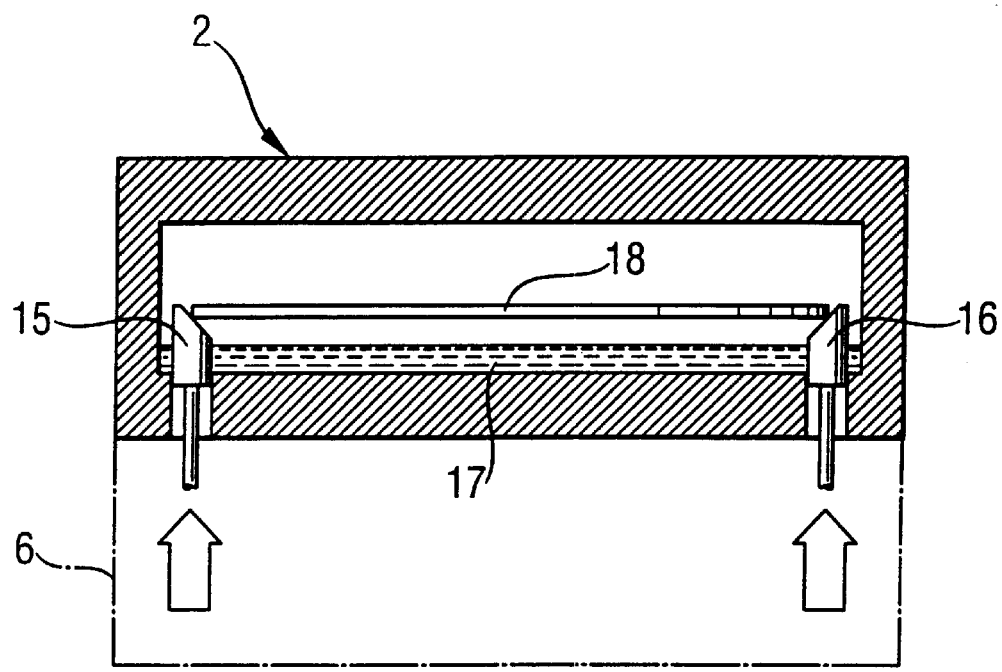
FIG. 2a shows the way in which a lifting means lifts a wafer in accordance with FIG. 1.
Figure 2B:
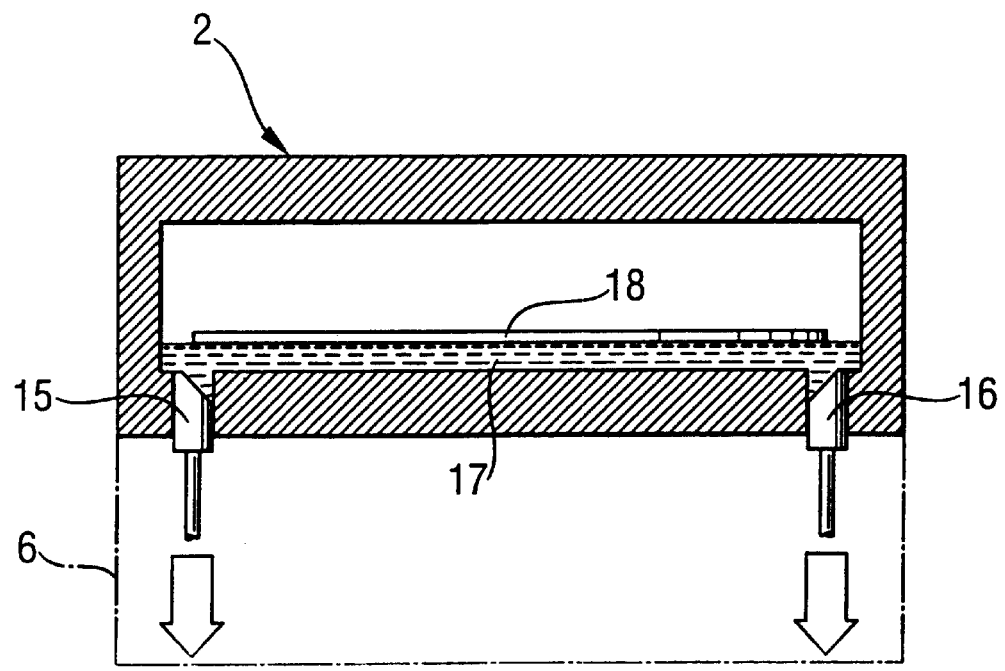

The way in which the lifting means 6, which essentially comprises two opposite jaws which can be raised and lowered, operates can be seen from FIGS. 2a and 2b. The jaws 15, 16 are arranged at the sides of the film of conveyor liquid 17 such as ultrapure water, and, in a raised state, hold the semiconductor wafer 18 above the film of conveyor liquid 17, touching the semiconductor wafer only in a peripheral area, preferably only at the edge (FIG. 2a). The robot in the transfer station deposits the semiconductor wafer, which is generally dry, on the raised jaws. When the jaws are lowered, the film of conveyor liquid 17 takes over the semiconductor wafer, wets it and conveys it to the cleaning station (FIG. 2b). The semiconductor wafer leaving the cleaning station is stopped and centered at the end of the conveyor path, above the lowered jaws, by the centering means 7, for example by mechanical stoppers or braking nozzles. After the jaws have been raised the wafer is picked up by the robot of the pick-up station and is moved onward, for example to a centrifuge drier (FIG. 1).

FIG. 1 shows that excess conveyor liquid 17 is caught by collectors 20 A and 20 B.

Figure 3:
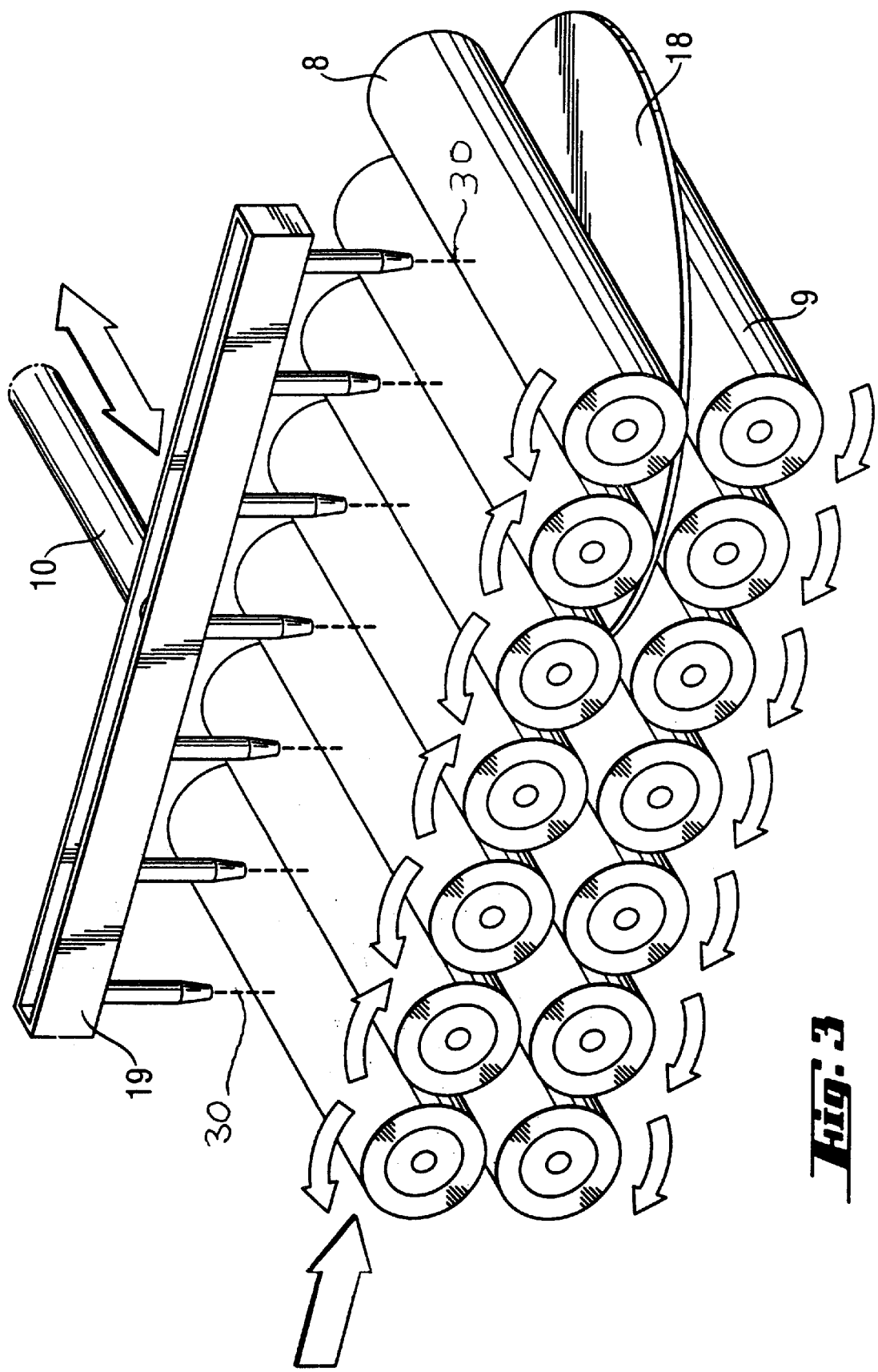
FIG. 3 shows a perspective view of the cleaning station and the means for supplying cleaning liquid from the device shown in FIG. 1.

Further details of the cleaning station 1 and of the means 10 for supplying the cleaning liquid 30 are shown in FIG. 3. Rollers which rotate in the direction in which the semiconductor wafer 18 is conveyed are primarily responsible for conveying the semiconductor wafer in the cleaning station. If the roller is rotating in the opposite direction, this primarily results in cleaning of the semiconductor wafer. Preferably, adjacent top rollers 8 are rotated in opposite directions, and the bottom rollers 9 are rotated in the conveying direction. To assist with cleaning, a roller located in the center of the bottom rollers may also be rotated in the opposite direction to the conveying direction. The distance between the top and bottom rollers of a pair of rollers is such that a semiconductor wafer which is conveyed between the rollers does not come into contact with the material of the rollers. The rotational speeds of the rollers are dimensioned in such a way that shear forces, which bring about cleaning and conveying of the semiconductor wafers, are generated in the liquid between the semiconductor wafer and the rollers.

The cleaning liquid 30 is supplied in such a way that the cleaning liquid is applied to the surfaces of the rollers in the form of a falling liquid which migrates over the rollers, in particular in the form of drops or a spray. In order to distribute the cleaning liquid over the entire length of the top rollers, the supply means 10 and feed pipes 19 are moved continuously over the rollers. Both the speed and the volume of the cleaning liquid supplied can be adjusted. The rollers are continuously wetted with ultrapure water or solutions of active substances. If desired, each top roller may be supplied with a different type of cleaning liquid. Consequently, a semiconductor wafer can be subjected to any desired combined cleaning sequence as it passes through the cleaning station. The excess cleaning liquid 30 is caught by collector 20 from which it may be recycled and/or purified and/or discarded if so desired.

The cleaning liquids which are used here are preferably selected from a group consisting of ultrapure water, aqueous alkaline liquids, aqueous acidic liquids, aqueous surfactant-containing liquids and mixtures of the abovementioned liquids. Suitable active substances are, for example, $NH_4OH$, choline, tetramethylammonium hydroxide, hydrogen fluoride and hydrogen chloride. It is also possible to deploy the cleaning liquid in a controlled way in order to set the desired surface properties of the semiconductor wafer, for example in order to produce hydrophilic surfaces or hydrophobic surfaces. The cleaning liquids should be provided at the level of purity which is required for treating semiconductor material.

In a further embodiment, it is possible that the conveyor liquid 17 can be identical to the cleaning liquid 30, or different therefrom.

Accordingly, while a few embodiments of the present invention have been shown and described, it is to be understood that many changes and modifications may be made thereunto without departing from the spirit and scope of the invention as defined in the appended claims.

What is claimed is:

1. A device for cleaning semiconductor wafers with a cleaning liquid, comprising
    a cleaning station with a plurality of rotating pairs of rollers which are arranged one behind another and to which a cleaning liquid is applied;
    each pair of rollers comprising a top roller and a bottom roller, and a semiconductor wafer being conveyed between the pairs of rollers;
    a means for supplying the cleaning liquid to the top rollers in the form of a falling liquid which migrates over the rollers; and
    a conveyor means for conveying the semiconductor wafer to and from the cleaning station, and having a film of conveyor liquid which is provided by the conveyor means and on which film of conveyor liquid the semiconductor wafer is conveyed.

2. The device as claimed in claim 1, comprising from 2 to 28 pairs of rollers.

3. The device as claimed in claim 1,
    wherein the cleaning liquid is different from the conveyor liquid.

4. The device as claimed in claim 1;
    wherein the cleaning liquid is the same as the conveyor liquid.

5. The device as claimed in claim 1,
    wherein the semiconductor wafer, while it is being conveyed between the pairs of rollers, only comes into contact with a film of cleaning liquid on the conveyor means, and the wafer contacts the cleaning liquid, without contacting solid components of the cleaning device.

6. A device for cleaning semiconductor wafers with a cleaning liquid, comprising
    a cleaning station with a plurality of rotating pairs of rollers which are arranged one behind another and to which a cleaning liquid is applied;
    each pair of rollers comprising a top roller and a bottom roller, and a semiconductor wafer being conveyed between the pairs of rollers;

a means for supplying the cleaning liquid to the top rollers in the form of a falling liquid which migrates over the rollers;

a conveyor means for conveying the semiconductor wafer to and from the cleaning station, and having a film of conveyor liquid which is provided by the conveyor means and on which film of conveyor liquid the semiconductor wafer is conveyed; and a lifting device for lowering the semiconductor wafer down onto the film of conveyor liquid and for lifting the semiconductor wafer up off the film of conveyor liquid, and having vertically adjustable jaws which are arranged at sides of the film of conveyor liquid and said jaws only touch the semiconductor wafer in a peripheral area of the wafer when said wafer is being lowered and lifted by said jaws.

7. A device for cleaning semiconductor wafers with a cleaning liquid, comprising a cleaning station with a plurality of rotating pairs of rollers which are arranged one behind another and to which a cleaning liquid is applied;

each pair of rollers comprising a top roller and a bottom roller, and a semiconductor wafer being conveyed between the pairs of rollers;

a means for supplying the cleaning liquid to the top rollers in the form of a falling liquid which migrates over the rollers;

a conveyor means for conveying the semiconductor wafer to and from the cleaning station, and having a film of conveyor liquid which is provided by the conveyor means and on which film of conveyor liquid the semiconductor wafer is conveyed;

a housing which surrounds the cleaning station and the conveyor means and creates the clean-room environment; said housing having a top and a bottom;

means for generating a laminar gas flow which flows through the housing from the top downward; and a suction device for extracting the gas flow from the housing at the bottom thereof.

\* \* \* \* \*